United States Patent [19]
Cook et al.

[11] Patent Number: 5,507,038
[45] Date of Patent: Apr. 9, 1996

[54] HEAT SEAL CONNECTOR WITH INTEGRAL PARTING AGENT

[75] Inventors: Kenneth E. Cook, Lake Worth; Jonathan Carr; John P. Cheraso, both of Boynton Beach, all of Fla.

[73] Assignee: Motorola, Inc., Schaumburg, Ill.

[21] Appl. No.: 338,973

[22] Filed: Nov. 14, 1994

Related U.S. Application Data

[63] Continuation of Ser. No. 44,672, Apr. 9, 1993, abandoned.

[51] Int. Cl.⁶ .................................................... H04B 1/08
[52] U.S. Cl. .................... 455/351; 455/38.4; 455/344; 455/347; 439/67; 439/77; 361/750; 359/88; 174/88 R
[58] Field of Search ...................... 455/344, 347, 455/351, 89, 90, 38.4; 174/254, 257, 259, 84 R, 88 R; 361/749, 785, 750, 789; 439/67, 77; 219/243, 543, 544; 359/88

[56] References Cited

U.S. PATENT DOCUMENTS

| | | |
|---|---|---|
| 3,813,268 | 5/1974 | Kerwin . |
| 4,357,197 | 11/1982 | Wilson . |
| 4,433,887 | 2/1984 | Sado et al. ............................ 174/88 R |
| 4,731,503 | 3/1988 | Kitanishi ............................... 174/88 R |
| 4,842,673 | 6/1989 | Kurihara . |
| 4,939,792 | 7/1990 | Urbish et al. ............................ 455/347 |
| 4,950,527 | 8/1990 | Yamada .................................. 361/749 |
| 5,223,965 | 6/1993 | Ota et al. .................................. 359/88 |

OTHER PUBLICATIONS

"Wireless Messaging From Your Desktop", Mobile Office, Dec. '92, 1 page attached.

*Primary Examiner*—Reinhard J. Eisenzopf
*Assistant Examiner*—Doris To
*Attorney, Agent, or Firm*—Kelly A. Gardner; Daniel K. Nichols; John H. Moore

[57] ABSTRACT

A heat seal connector (100) includes a flexible substrate (105), interconnects (110) disposed thereon, and a parting agent (115) contiguous with the flexible substrate (105) for preventing the heat seal connector (100) from adhering to a heating platen (505) applied thereto, wherein the heating platen (505) does not include a parting agent for preventing the heat seal connector (100) from adhering to the healing platen (505). The heat seal connector (100) is bonded to first and second electronic circuits (415, 420) during application of the heating platen (505) such that the interconnects (110) electrically couple conductive pads (417) formed on the first electronic circuit (415) to corresponding conductive pads (425) formed on the second electronic circuit (420).

14 Claims, 3 Drawing Sheets

5,507,038

HEAT SEAL CONNECTOR WITH INTEGRAL PARTING AGENT

This is a continuation of application Ser. No. 08/044,672, filed Apr. 9, 1993, now abandoned.

FIELD OF THE INVENTION

This invention relates in general to electrical connectors, and more specifically to a heat seal connector which includes an integral parting agent and a bonding apparatus for use therewith.

BACKGROUND OF THE INVENTION

Electrical connectors are conventionally utilized to couple one electronic assembly to another. One type of electrical connector is a heat seal connector, which is typically manufactured from a flexible material, such as mylar, having graphite interconnects disposed thereon. The heat seal connector is bonded to an electronic assembly, e.g., a printed circuit board, in a process wherein heat and pressure are applied thereto. In automated processes, interconnects of the heat seal connector are aligned with corresponding conductive pads formed on the printed circuit board utilizing optical alignment techniques. Thereafter, a conventional heat seal machine is employed to apply both heat and pressure to the interconnects, thereby bonding the interconnects to the pads of the printed circuit board.

The heat seal machine generally comprises a heating platen which is heated by a heating element and around which a parting agent, such as a thin silicone sheet, is disposed. When the heating platen is lowered by the heat seal machine, the silicone sheet contacts the interconnects to transfer heat thereto while preventing the heat seal connector from adhering to the heating platen. After each application, the silicone sheet is advanced across the heating platen such that an unused portion of the silicone sheet is positioned between the heating platen and the heat seal connector during the bonding process.

A drawback to the use of conventional heat seal connectors and conventional heat seal machines, however, is the fact that the silicone holding and advancing mechanisms of the heat seal machines are usually very bulky. Therefore, typical alignment methods, in which the heat seal connector and the printed circuit board are optically aligned, can sometimes yield inaccurate results because the silicone holding and advancing mechanisms coupled to the heating platen can interfere with the image recorded by an alignment device, such as a camera. In an attempt to overcome the possibility of inaccurate alignment, some conventional heat seal machines perform the alignment operation prior to positioning a fixture containing the heat seal connector and the printed circuit board beneath the heating platen. Although, in this manner, the alignment can be more accurately performed, the movement of the printed circuit board and the heat seal connector to a location beneath the heating platen after alignment can disturb the alignment of the two parts.

Furthermore, because the silicone holding and advancing mechanisms typically extend outward from the heating platen, the areas surrounding the conductive pads of a printed circuit board must often remain cleared of components to prevent interference with the holding and advancing mechanisms during the bonding process. This is very undesirable because consumer devices, such as pagers, are becoming smaller and more streamlined, and, as a result, the space available on printed circuit boards must be utilized more efficiently to accommodate a greater number of electrical and mechanical components, i.e., resistors, connectors, etc.

Thus, what is needed is a heat seal connection process that does not prevent component placement in areas of a printed circuit board surrounding the regions where the heating platen contacts the printed circuit board. Additionally, the heat seal connection process should provide for more accurate alignment of the heat seal connector with the printed circuit board.

SUMMARY OF THE INVENTION

A heat seal connector includes a flexible substrate having first and second surfaces opposite each other. Interconnects are disposed on the first surface of the flexible substrate for electrically coupling circuits external to the heat seal connector, and a flexible, electrically insulative parting agent is contiguous with the second surface of the flexible substrate for preventing the heat seal connector from adhering to a heating platen applied thereto during a heat seal process in which the circuits external to the heat seal connector are electrically coupled via the interconnects. During the heat seal process, the heating platen contacts the parting agent and neither the flexible substrate nor the interconnects disposed thereon.

DESCRIPTION OF A PREFERRED EMBODIMENT

Figure 1:
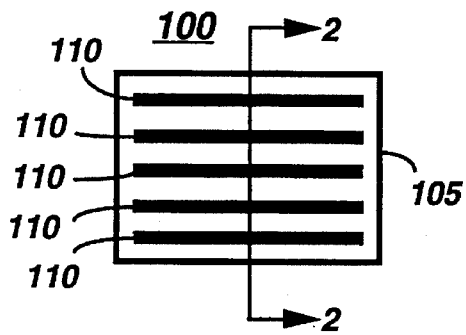
FIG. 1 is a top plan view of a heat seal connector in accordance with the present invention.
Figure 2:
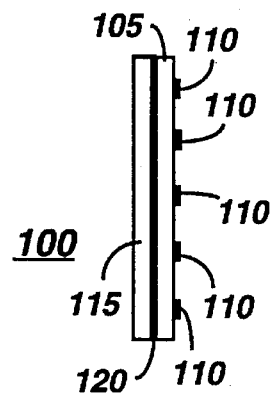
FIG. 2 is a cutaway view of the heat seal connector of FIG. 1 in accordance with the present invention.

Referring to FIGS. 1 and 2, top plan and cutaway views, respectively, of a heat seal connector 100 in accordance with the present invention are shown. The heat seal connector 100 preferably comprises a substrate 105 formed from a flexible material such as a polymer, e.g., polyester, polyimide, or aramid. Conductive interconnects 110 disposed on a first surface of the flexible substrate 105 are formed, for example, from a polymer thick film ink containing carbon, copper, silver, or gold. On a second surface of the flexible substrate 105 opposite the first surface, i.e., the surface on which the interconnects 110 are disposed, a parting agent 115 is mounted to the flexible substrate 105. The parting agent 115, which is formed from a compliant polymer material such as silicone, urethane, or latex, is utilized to prevent the heat seal connector 100 from adhering to a heating platen (not shown) for applying heat and pressure thereto. The parting agent 115 is preferably secured to the flexible substrate 105 by a pressure sensitive adhesive 120, although there are some conventional screening techniques for applying the parting agent 115 to the flexible substrate 105 in which the adhesive 120 may not be necessary.

Although the parting agent 115 and the interconnects 110 are shown as being formed on opposite surfaces of the flexible substrate 105, it may be appreciated by one of ordinary skill in the art that more complex heat seal connectors manufactured according to the present invention may employ parting agents disposed on multiple areas of the flexible substrates when necessary for heat shielding.

Figure 3:
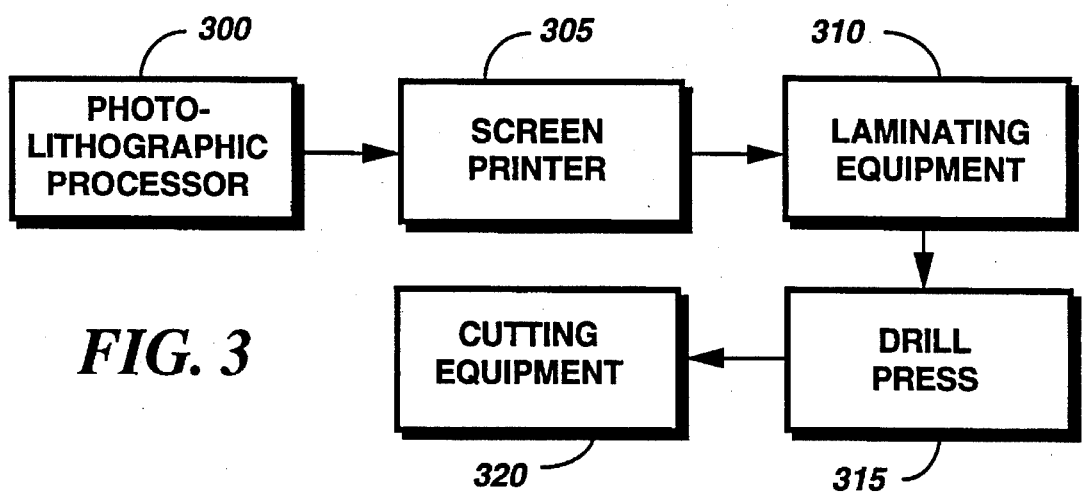
FIG. 3 is a flow diagram depicting a process which can be utilized to manufacture the heat seal connector of FIG. 1 in accordance with the present invention.

FIG. 3 is a flow diagram of a process by which the heat seal connector 100 can be manufactured. Initially, a photo-lithographic processor 300 is employed to deposit patterns defining the interconnects 110 (FIGS. 1, 2) onto a sheet of substrate material, e.g., mylar, polyimide, etc. Thereafter, a screen printer 305 prints the interconnect material, e.g., carbon ink, onto the sheet of substrate material. Laminating equipment 310 is then utilized to secure the parting agent material which may include a layer of the adhesive 120, to the sheet of substrate material, after which tooling holes are drilled in selected locations by a drill press 315 or punched by punch equipment. The manufacturing process is concluded when cutting equipment 320 cuts the sheet of substrate material into individual sections to form the heat seal connector 100 according to the present invention.

Figure 4:
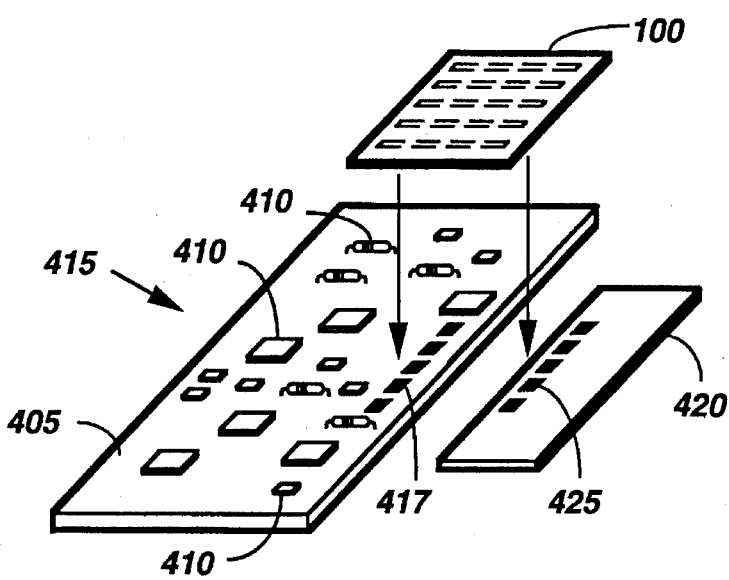
FIG. 4 is a perspective view of first and second electronic circuits which can be electrically coupled by the heat seal connector of FIG. 1 in accordance with the present invention.

Referring next to FIG. 4, first and second electronic circuits which can be coupled by the heat seal connector 100 are depicted. The first electronic circuit may be, for example, a printed circuit board 405 on which receiver components 410 are placed to form a receiver 415 for use in a radio communication device for decoding selective call messages from received radio frequency signals. The receiver 415 preferably includes a first plurality of conductive pads 417 formed on the printed circuit board 405 for electrically coupling the receiver 415 to the interconnects 110 (FIGS. 1, 2) of the heat seal connector 100, as will be described below. As shown in FIG. 4, the components 410 can be placed very near the first plurality of conductive pads 417, thereby efficiently utilizing the available area of the printed circuit board 405.

The second electronic circuit may be, for example, a display device 420, e.g., a liquid crystal display, for displaying the decoded selective call messages. The display device 420, similar to the printed circuit board 405, has formed thereon a second plurality of conductive pads 425 for electrically coupling the display device 420 to the interconnects 110 of the heat seal connector 100.

Figure 5:
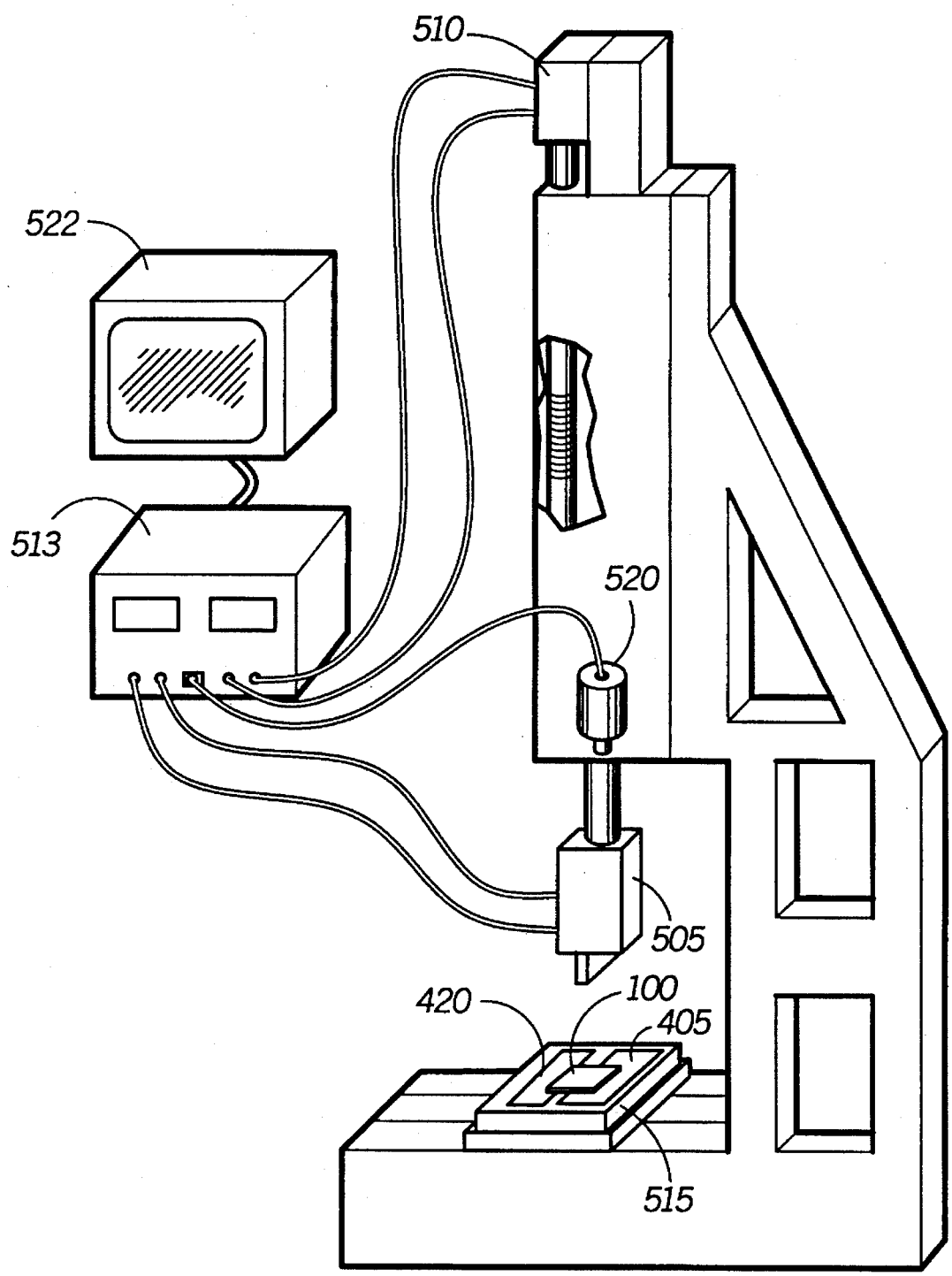
FIG. 5 is a perspective view of a bonding apparatus for bonding the heat seal connector of FIG. 1 in accordance with the present invention.

Referring next to FIG. 5, an apparatus for bonding the heat seal connector 100 to the printed circuit board 405 and the display device 420 comprises a heating platen 505 formed from a thermally conductive material such as beryllium copper and coupled to a conventional pneumatic press 510. The temperature of the heating platen 505 and the pressure with which the pneumatic press 510 lowers the heating platen 505 are controlled by a conventional controller 513, such as model number E5KN manufactured by Omron, Inc. Preferably, the interconnects 110 (FIGS. 1, 2) of the heat seal connector 100 are roughly aligned with the conductive pads 417, 425 (FIG. 4) formed on the printed circuit board 405 and the display device 420 in a fixture 515, which is shuttled beneath the heating platen 505 either manually or by a conveyor belt According to the present invention, the heat seal connector 100 is mounted in the fixture 515 such that the parting agent 115 (FIGS. 1, 2) is exposed to the heating platen 505, i.e., the parting agent 115 is facing upwards.

The bonding apparatus further comprises one or more cameras 520 or other image recording devices mounted near the heating platen 505 such that an optical image of the conductive pads 417, 425 (FIG. 4) and the interconnects 110 (FIGS. 1, 2) is provided to a monitor 522 for displaying the image while the fixture 515 is located beneath the heating platen 505. In this manner, minor adjustments in the positions of the printed circuit board 405 and the heat seal connector 100 can be made while the fixture 515 is located beneath the heating platen 505, eliminating situations in which the fixture 515 must be moved beneath the heating platen 505 after the alignment process. Thereafter, the controller 513 activates the pneumatic press 510 to lower the heating platen 505 into contact with selected regions of the heat seal connector 100 wherein the interconnects 110 of the heat seal connector 100 contact the conductive pads 417, 420 formed on the printed circuit board 405 and the display device 420. The application of heat and pressure by the heating platen 505 bonds the interconnects 110 to the conductive pads 417, 425, thereby electrically coupling the first plurality of conductive pads 417 to the second plurality of conductive pads 425 via the heat seal connector 100. The parting agent 115, as described above, prevents the heat seal connector 100 from adhering to the heating platen 505 during the bonding process, as well as distributing the load of the heating platen 505.

The bonding apparatus described above does not include a parting agent coupled to the heating platen 505, unlike conventional heat seal machines used for applying heat and pressure to heat seal connectors. Generally, conventional heat seal machines include a sheet of silicone for use as a parting agent as well as mechanisms for holding and advancing the silicone sheet. These mechanisms are typically very bulky and prevent the positioning of a camera near the heating platen. As a result, the alignment of a printed circuit board with a heat seal connector can sometimes be inaccurate, thus causing faulty electrical connections. Furthermore, the silicone sheet and the holding and advancing mechanisms therefor typically extend radially outward from the heating platen. Therefore, components often cannot be placed near regions on a printed circuit board where the heat seal connector is to be bonded.

The bonding apparatus according to the present invention, however, does not require either a silicone sheet or bulky holding mechanisms because the parting agent 115 is included on the heat seal connector 100 rather than the bonding apparatus. The components 410 (FIG. 4) mounted on the printed circuit board 405 can thus be placed very near the first plurality of conductive pads 417 without interfering with the heating platen 505 during the bonding process. Additionally, the printed circuit board 405 and the heat seal connector 100 can be more precisely aligned because the camera 520 can be positioned nearer the heating platen 505 than possible in prior art heat seal machines. These advantages render the heat seal connector 100 according to the present invention extremely useful for coupling electronic circuits in crowded, small consumer devices, such as portable radio communication devices, e.g., pagers.

Figure 6:
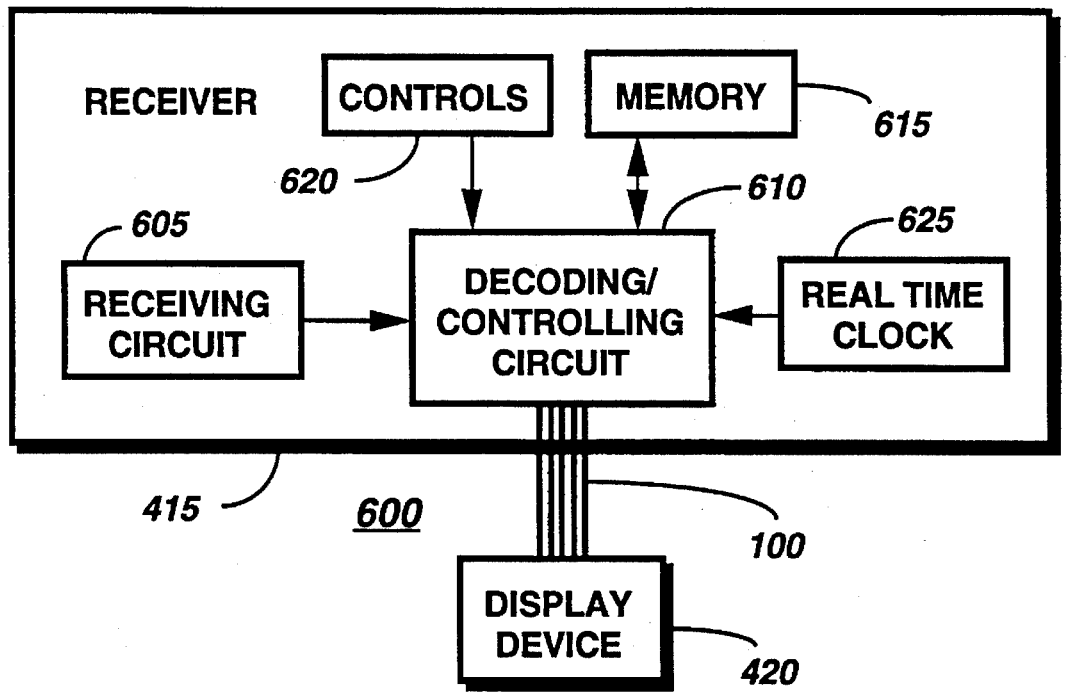
FIG. 6 is an electrical block diagram of a radio communication device which includes the heat seal connector of FIG. 1 in accordance with the present invention.

FIG. 6 is an electrical block diagram of a portable radio communication device 600 for receiving radio frequency signals. The receiver 415 included in the radio communication device 600 comprises a receiving circuit 605 for receiving and demodulating a radio frequency signal and a decoding/controlling circuit 610 coupled to the receiving circuit 605 for decoding a selective call message from the demodulated signal and for controlling the operation of the radio communication device 600. The display device 420, which is preferably coupled to the receiver 415 by the heat seal connector 100, displays the selective call message to a user.

With the advent of surface mount technology, which allows the manufacture of smaller components, a greater number of features have been included in radio communication devices, such as pagers and two-way radios. Therefore, the receiver 415 of the radio communication device 600 may further comprise a memory 615 for temporarily storing decoded selective call messages and user controls 620 by which a user can manually select the presentation of a stored selective call message on the display device 420. Additionally, the receiver 415 may include a real time clock 625 for providing real time values which are displayed by the display device 420, perhaps in response to commands entered via the controls 620.

While recently designed radio communication devices usually include a large number of features, market trends have dictated that the devices, especially portable communication devices such as pagers, become smaller and more streamlined to meet customer demand. As a result, printed circuit boards, such as the printed circuit board 405 (FIG. 4) are becoming increasingly crowded with components 410. Therefore, use of the heat seal connector 100 in portable communication devices is especially beneficial because areas of the printed circuit board 405 near the conductive pads 417 can be populated with components 410, unlike printed circuit boards electrically coupled to conventional heat seal connectors.

Figure 7:
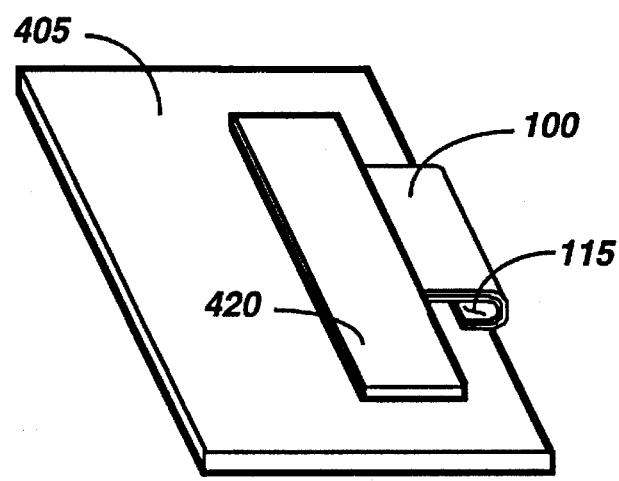
FIG. 7 is an illustration of an electronic assembly including the heat seal connector of FIG. 1 in accordance with the present invention.

FIG. 7 illustrates an electronic assembly comprising the printed circuit board 405, the display device 420, and the heat seal connector 100. As described above, the heat seal connector 100 includes a flexible substrate 105 (FIGS. 1, 2) and can therefore be flexed, similar to conventional heat seal connectors, to allow movement of the printed circuit board 405 and the display device 420 relative to each other, thereby creating a stress on the heat seal connector 100. However, the stress on the heat seal connector 100 according to the present invention is minimized because the parting agent 115 conveniently strengthens the heat seal connector 100. Conventional heat seal connectors, which do not have an integral parting agent, are not as strong as the heat seal connector 100. A urethane foam pad is therefore often assembled to a conventional heat seal connector to relieve stress on the part. This foam pad not only requires a further assembly step, but also increases the cost of a conventional heat seal connector.

In summary, the heat seal connector according to the present invention has integrally formed thereon a parting agent, such as silicone, for heat-shielding the heat seal connector during a bonding process. As a result, a bonding apparatus for bonding the heat seal connector can utilize a relatively small heating platen that does not include a parting agent or mechanisms for holding the parting agent. This bonding apparatus, which is devoid of a parting agent, is much less bulky than conventional heat seal machines, which utilize a silicone sheet and holders for securing the silicone sheet.

Because the bonding apparatus described above does not need a parting agent wrapped around the heating platen, cameras utilized for optical alignment can be located very near the heating platen, thereby providing for a very accurate alignment of a printed circuit board with the heat seal connector. Additionally, components can be placed near printed circuit board pads, which are to be coupled to heat seal connector interconnects, without interfering with the heating platen during the bonding process.

A further feature of the present invention is that the parting agent integrally included on the heat seal connector according to the present invention strengthens the heat seal connector such that stress is reduced during bending of the heat seal connector. As a result, the heat seal connector does not require a separate urethane foam pad for stress relief. The heat seal connector according to the present invention, therefore, is less expensive and requires less assembly than conventional heat seal connectors, which utilize a separate part for stress relief.

It may be appreciated by now that there has been provided a heat seal connector and bonding apparatus for use therewith that allows more efficient utilization of the area of a printed circuit board to which the heat seal connector is bonded. Additionally, the heat seal connector can be more precisely aligned with the printed circuit board because the bonding apparatus is less bulky than conventional heat seal machines, and the heat seal connector does not require an additional part, such as a foam pad, to provide stress relief during bending.

What is claimed is:

1. A heat seal connector, comprising:
   a flexible substrate having first and second surfaces opposite each other;
   interconnects disposed on the first surface of the flexible substrate for electrically coupling circuits external to the heat seal connector; and
   a flexible, electrically insulative parting agent contiguous with the second surface of the flexible substrate for preventing the heat seal connector from adhering to a heating platen applied thereto during a heat seal process in which the circuits external to the heat seal connector are electrically coupled via the interconnects, wherein, during the heat seal process, the heating platen contacts the parting agent and neither the flexible substrate nor the interconnects disposed thereon.

2. The heat seal connector according to claim 1, wherein the flexible substrate is formed from a polymer material.

3. The heat seal connector according to claim 1, wherein the interconnects are formed from a polymer thick film ink.

4. The heat seal connector according to claim 1, wherein the parting agent is formed from a compliant polymer material.

5. The heat seal connector according to claim 1, further comprising an adhesive for bonding the parting agent to the flexible substrate.

6. An electronic assembly, comprising:
   a first electronic circuit having a first plurality of conductive pads;
   a second electronic circuit having a second plurality of conductive pads; and
   a heat seal connector for coupling the first and second electronic circuits, the heat seal connector comprising:
   a flexible substrate having first and second surfaces opposite each other;
   interconnects disposed on the first surface of the flexible substrate for electrically coupling the first and second pluralities of conductive pads; and
   a flexible, electrically insulative parting agent contiguous with the second surface of the flexible substrate for preventing the heat seal connector from adhering to a heating platen applied thereto during a heat seal process in which the first and second pluralities of conductive pads are electrically coupled via the interconnects, wherein, during the heat seal process, the heating platen contacts the parting agent and neither the flexible substrate nor the interconnects disposed thereon.

7. The electronic assembly according to claim 6, wherein the flexible substrate is formed from a polymer material.

8. The electronic assembly according to claim 6, wherein the interconnects are formed from a polymer thick film ink.

9. The electronic assembly according to claim 6, wherein the parting agent is formed from a compliant polymer material.

10. The electronic assembly according to claim 6, further comprising an adhesive for bonding the parting agent to the flexible substrate.

11. The electronic assembly according to claim 6, wherein the first electronic circuit is a printed circuit board.

12. The electronic assembly according to claim 6, wherein the second electronic circuit is a liquid crystal display.

13. A radio communication device for receiving radio frequency signals, comprising:
   a receiver for receiving a radio frequency signal and decoding therefrom a selective call message, the receiver comprising a first plurality of conductive pads;
   a display device for displaying the selective call message, the display device comprising a second plurality of conductive pads; and
   a heat seal connector for providing the selective call message from the receiver to the display device, the heat seal connector comprising:
      a flexible substrate having first and second surfaces opposite each other;
      interconnects disposed on the first surface of the flexible substrate for electrically coupling the first and second pluralities of conductive pads; and
      a flexible, electrically insulative parting agent contiguous with the second surface of the flexible substrate for preventing the heat seal connector from adhering to a heating platen applied thereto during a heat seal process in which the first and second pluralities of conductive pads are electrically coupled via the interconnects, wherein, during the heat seal process, the heating platen contacts the parting agent and neither the flexible substrate nor the interconnects disposed thereon.

14. The radio communication device according to claim 13, further comprising an adhesive for bonding the parting agent to the flexible substrate.

\* \* \* \* \*